United States Patent
Matsuyama et al.

(10) Patent No.: US 7,429,539 B2
(45) Date of Patent: Sep. 30, 2008

(54) NITRIDING METHOD OF GATE OXIDE FILM

(75) Inventors: Seiji Matsuyama, Kyoto (JP); Takuya Sugawara, Nirasaki (JP); Shigenori Ozaki, Amagasaki (JP); Toshio Nakanishi, Amagasaki (JP); Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 46 days.

(21) Appl. No.: 11/616,217

(22) Filed: Dec. 26, 2006

(65) Prior Publication Data

US 2007/0134895 A1    Jun. 14, 2007

Related U.S. Application Data

(63) Continuation of application No. 10/988,561, filed on Nov. 16, 2004, now Pat. No. 7,232,772, which is a continuation-in-part of application No. PCT/JP03/06080, filed on May 15, 2003.

(30) Foreign Application Priority Data

May 16, 2002    (JP)    .............. 2002-141654

(51) Int. Cl.
H01L 21/31    (2006.01)
H01L 21/469    (2006.01)

(52) U.S. Cl. ............... 438/770; 438/769; 257/E21.193; 257/E21.209

(58) Field of Classification Search ................ 438/770, 438/769, 772, 775, 765, 771, 787; 257/E21.193, 257/E21.209, E21.215, E21.218
See application file for complete search history.

(56) References Cited

U.S. PATENT DOCUMENTS

| | | | |
|---|---|---|---|
| 6,287,988 B1 | 9/2001 | Nagamine et al. | |
| 6,313,047 B2 | 11/2001 | Hasebe et al. | |
| 2002/0002948 A1 | 1/2002 | Hongo et al. | |
| 2002/0073925 A1 | 6/2002 | Noble et al. | |
| 2003/0214001 A1* | 11/2003 | Yasuda et al. | ............... 257/392 |
| 2004/0007756 A1* | 1/2004 | Nishiyama et al. | .......... 257/506 |
| 2004/0023513 A1* | 2/2004 | Aoyama et al. | ............. 438/778 |
| 2004/0048452 A1 | 3/2004 | Sugawara et al. | |
| 2004/0142577 A1 | 7/2004 | Sugawara et al. | |
| 2004/0235311 A1 | 11/2004 | Nakanishi et al. | |

(Continued)

FOREIGN PATENT DOCUMENTS

JP    2000-332009    11/2000

(Continued)

OTHER PUBLICATIONS

Gerald Lucovsky "Silicon Oxide/Silicon Nitride Dual-Layer Films: a stacked gate dielectric for the 21st century" Journal of Non-Crystalline Solids vol. 254 (1999), pp. 26-37.

(Continued)

*Primary Examiner*—Walter L Lindsay, Jr.
(74) *Attorney, Agent, or Firm*—Oblon, Spivak, McClelland, Maier & Neustadt, P.C.

(57) ABSTRACT

A substrate processing method comprises the step of forming an oxide film on a silicon substrate surface, and introducing nitrogen atoms into the oxide film by exposing the oxide film to nitrogen radicals excited in plasma formed by a microwave introduced via a planar antenna.

31 Claims, 11 Drawing Sheets

U.S. PATENT DOCUMENTS

| | | |
|---|---|---|
| 2004/0241968 A1 | 12/2004 | Murakawa et al. |
| 2004/0250771 A1 | 12/2004 | Ozaki et al. |
| 2005/0003660 A1 | 1/2005 | Murakawa et al. |
| 2005/0005844 A1 | 1/2005 | Kitagawa et al. |
| 2005/0153570 A1 | 7/2005 | Matsuyama et al. |
| 2005/0176223 A1 | 8/2005 | Matsuyama et al. |
| 2006/0199398 A1 | 9/2006 | Sugawara et al. |

FOREIGN PATENT DOCUMENTS

| | | |
|---|---|---|
| JP | 2001-15507 A | 1/2001 |
| JP | 2001-274151 A | 10/2001 |
| JP | 2003-68731 A | 3/2003 |
| WO | WO 03/052810 A1 | 6/2003 |
| WO | WO 03/056622 A1 | 7/2003 |

OTHER PUBLICATIONS

U.S. Appl No. 11/616,217, filed Dec. 26, 2006, Matsuyama, et al.
U.S. Appl No. 11/514,236, filed Sep. 1, 2006, Matsuyama, et al.

* cited by examiner

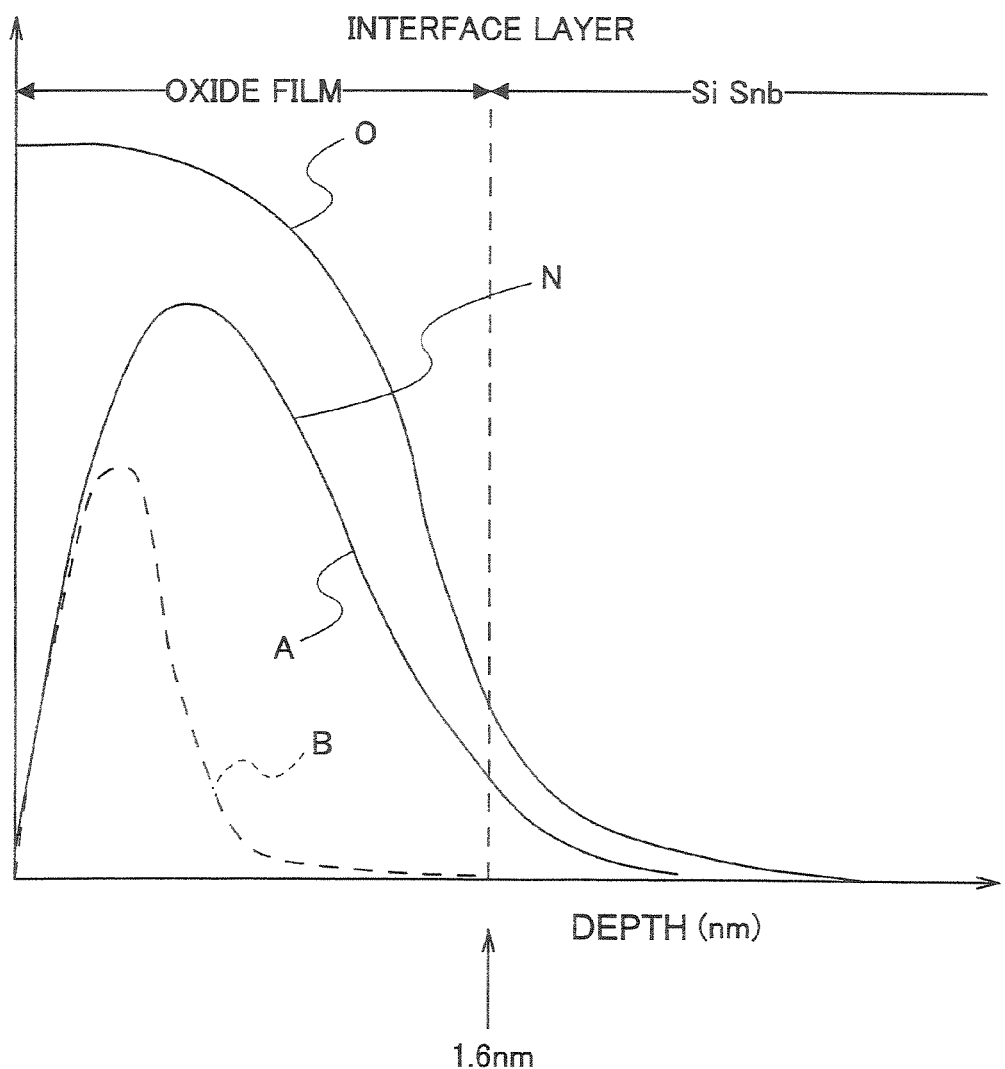

NITRIDING METHOD OF GATE OXIDE FILM

CROSS-REFERENCE TO RELATED APPLICATIONS

The present application is a continuation of application Ser. No. 10/988,501, now allowed, which is a continuous-in-part application of PCT/JP2003/006080 filed on May 15, 2003 based on Japanese Patent Application 2002-141654 filed on May 16, 2002, the entire contents of these are incorporated herein as reference.

BACKGROUND OF THE INVENTION

The present invention generally relates to substrate processing method and more particularly to a nitriding method of an oxide film formed on a silicon substrate surface.

With progress in the art of device miniaturization, fabrication of ultrafine semiconductor devices having a gate length of less than 0.1 μm is now becoming possible.

In order to achieve improvement of operational speed of the semiconductor device with such ultrafine semiconductor devices by way of decrease of the gate length, there is a need to decrease the thickness of the gate insulation film according to scaling law. In the case of using a conventional thermal oxide film for the gate insulation film, for example, it is necessary to reduce the thickness of the gate insulation film to be equal to or smaller than the conventional thickness of 1.7 nm. However, such a decrease of thickness of the oxide film invites increase of the gate leakage current through the oxide film as a result of tunneling effect.

Thus, there have been studies to use a high-K dielectric film such as $Ta_2O_5$ or $ZrO_2$ for the gate insulation film in place of the conventional silicon oxide film. However, these high-K dielectric films have a nature very much different from that of the silicon oxide film used conventionally in the semiconductor technology, and there remain numerous problems to be solved before such high-K dielectric film is used for the gate insulation film.

Contrary to this, a silicon nitride film has a material used conventionally in the semiconductor processes, and is thought as being a promising material for the gate insulation film of the next-generation high-speed semiconductor devices in view of its specific dielectric constant, which is twice as large as that of a silicon oxide film.

Conventionally, a silicon nitride film has been formed on an interlayer insulation film by a plasma CVD process. However, such a CVD nitride film generally has the feature of large leakage current, and the use thereof for a gate insulation film has been inappropriate. In fact, no attempts have been made conventionally to use a nitride film for a gate insulation film.

Meanwhile, there have been proposed recently the technology of nitriding a surface of a silicon oxide film and convert the same to an oxynitride film by generating N radicals or NH radicals by introducing a gas containing nitrogen such as a nitrogen gas, nitrogen and hydrogen gases or an $NH_3$ gas into microwave-excited rare gas plasma of Ar, Kr, or the like. The oxynitride film thus formed has the feature of small oxide-film equivalent thickness and also the feature of leakage current characteristics comparable to or even surpassing that of a thermal oxide film, and thus, the oxynitride film thus formed is thought as being a promising material for the gate insulation film of the next-generation high-speed semiconductor devices. Further, the oxynitride film thus formed is chemically stable, and it is possible to suppress, in the case a high-K dielectric film is formed on the oxynitride film, the diffusion of metal elements in the high-K dielectric film through the oxynitride film and associated reaction of the high-K dielectric film with the silicon substrate caused by way of such diffusion. Further, there is proposed a technology of directly nitriding a silicon substrate surface by such microwave plasma.

Conventionally, it has been known to introduce nitrogen into an oxide film by a thermal annealing process conducted in nitrogen ambient or by an implantation of nitrogen ions. On the other hand, it is known that the nitrogen atoms introduced according to such a process predominantly concentrate in the vicinity of the interface between the silicon substrate and the oxide film. As a result, in the case such a conventional oxynitride film is used for the gate insulation film of a MOS transistor, there are caused problems such as variation of the threshold voltage or degradation of mobility caused by formation of the interface states.

Because of similar reasons, there can be caused deterioration of semiconductor device characteristics also in the case of an oxynitride film processed by N radicals or NH radicals is used, instead of the desired improvement of semiconductor device characteristics, unless the distribution of the nitrogen atoms in the film is controlled appropriately.

SUMMARY OF THE INVENTION

Accordingly, it is a general object of the present invention to provide a novel and useful substrate processing method wherein the foregoing problems are eliminated.

Another object of the present invention is to provide a nitridation method of an oxide film capable of optimizing distribution of nitrogen atoms in the film.

Another object of the present invention is to provide a substrate processing method, characterized by the steps of:
forming an oxide film on a silicon substrate surface;
introducing nitrogen atoms into said oxide film by exposing said oxide film to nitrogen radicals or nitrogen ions excited in microwave plasma.

According to the present invention, it becomes possible to obtain an oxynitride film having optimum characteristics including the leakage current characteristics by choosing processing pressure according to an initial film thickness of the oxide film at the time of nitriding an oxide film by microwave-excited nitrogen radicals.

Other objects and further features of the present invention will become apparent from the following detailed description when read in conjunction with the attached drawings.

BRIEF DESCRIPTION OF THE DRAWINGS

FIG. 3 is a diagram showing the distribution of the nitrogen atoms in the oxynitride film obtained with an embodiment of the present invention;

DETAILED DESCRIPTION OF THE PREFERRED EMBODIMENT

In the investigation constituting the foundation of the present invention, the inventor of the present invention has discovered, in the experiments of nitriding an oxide film by nitrogen radicals excited by Ar gas plasma, that the distribution of the nitrogen atoms in the film changes significantly depending on the nitridation processing condition, especially the processing pressure and processing time.

Thus the object of the present invention is to provide, based on the foregoing knowledge, a nitridation method of an oxide film capable of optimizing the distribution of the nitrogen atoms in the film.

First Embodiment

Figure 1A:
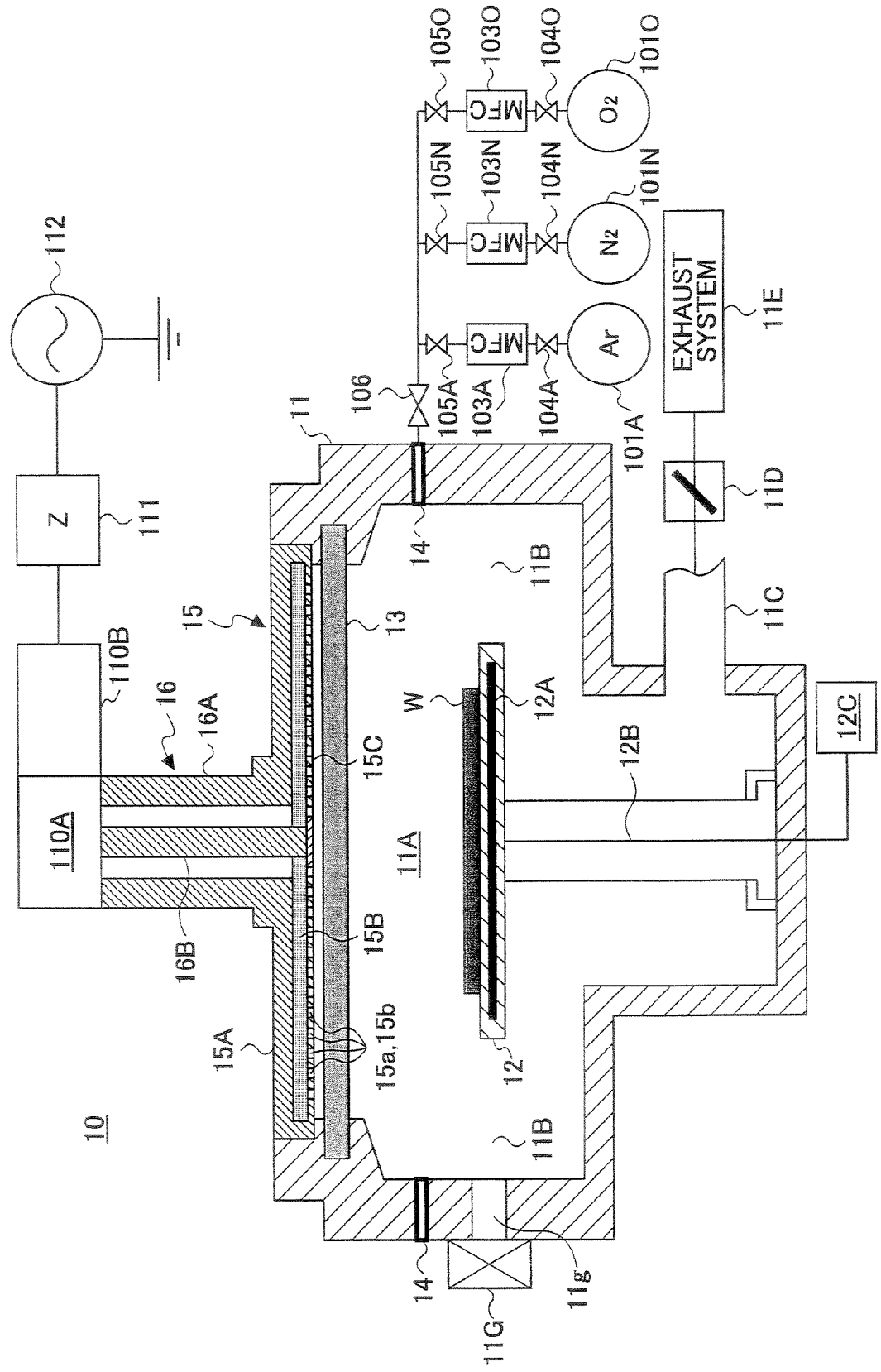
FIGS. 1A and 1B are diagrams showing the construction of a microwave plasma processing apparatus used with the present invention.

FIG. 1A shows the schematic construction of a plasma processing apparatus 10 used with the present invention.

Referring to FIG. 1A, the plasma substrate processing apparatus 10 includes a processing vessel 11 in which a processing space 11A is formed such that a stage 12 holding a substrate W to be processed thereon is formed in the processing space 11A, wherein the processing vessel 11 is evacuated by an evacuation system 11E at an evacuation port 11C via a space 11B surrounding the stage 12 and an adaptive pressure controller 11D.

The stage 12 is provided with a heater 12A, wherein the heater 12A is driven by a power source 12C via a line 12B.

Further, the processing vessel 11 is provided with a substrate in/out opening 11g and a gate valve 11G cooperating therewith for loading and unloading of the substrate W to be processed to and from the processing vessel 11.

On the processing vessel 11, there is formed an opening in correspondence to the substrate W to be processed on the stage 12, and the opening is closed by a top plate 13 of quartz or a low-loss ceramic such as alumina or AlN. Further, underneath the top plate 13, there are formed a gas ring 14 formed with a gas inlet path and a large number of nozzle openings communicating therewith such that the gas ring 14 faces the substrate W to be processed.

It should be noted that the cover plate 13 forms a microwave window, and a flat microwave antenna 15 of a radial line slot antenna or a horn antenna is provided on the top part of the top plate 13.

In the illustrated example, a radial line slot antenna is used for the flat microwave antenna 15, wherein it should be noted that the radial line slot antenna includes a flat antenna main part 15A and a radiation plate 15C, wherein the radiation plate 15C is provided at the opening part of the flat antenna main part 15A via a retardation plate 15B of quartz or alumina.

The radiation plate 15C is provided with a large number of slots 15a and 15b as will be explained with reference to FIG. 1B, wherein the radial line slot antenna 15 is connected to a coaxial waveguide 16 having an outer conductor 16A connected to the antenna main part 15A of the radial line slot antenna 15 and a central conductor 16B connected to the radiation plate 15C through the retardation plate 15B. The coaxial waveguide 16 is connected to a rectangular waveguide 110B via a mode conversion part 110A, wherein the rectangular waveguide 110B is connected to a microwave source 112 via an impedance matcher 111. Thereby, the microwave source 112 supplies a microwave to the radial line slot antenna 15 via the rectangular waveguide 110B and the coaxial waveguide 16.

Figure 1B:
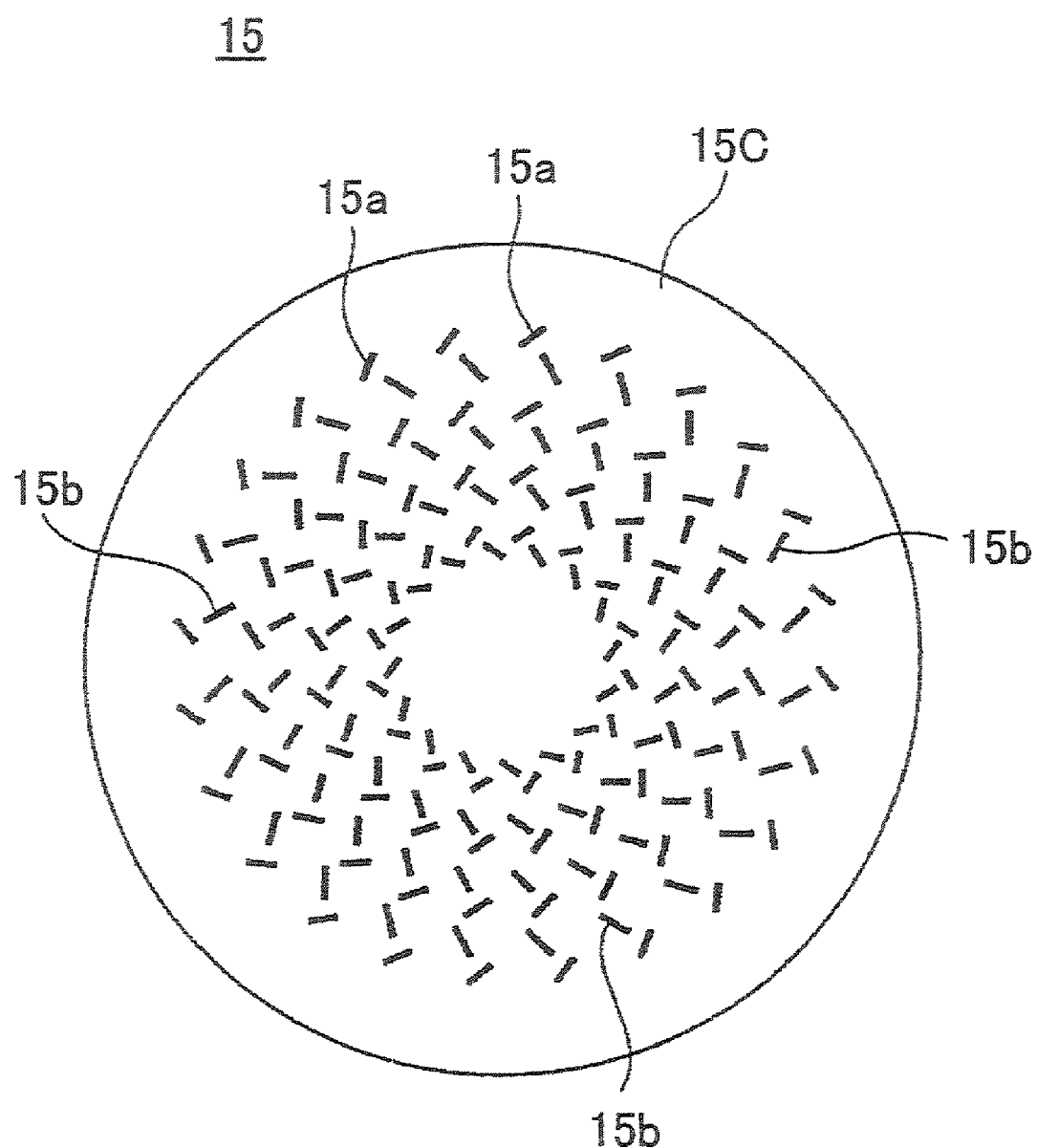

FIG. 1B shows the construction of the radial line slot antenna.

Referring to FIG. 1B showing the radiation plate 15C in a plan view, it can be seen that the slots 15a and 15b are formed in a concentric relationship in such a manner that a slot 15a and an adjacent slot 15b form an angle of 90 degrees.

Thereby, the microwave supplied from the coaxial waveguide 16 spreads in the radial direction in the radial line slot antenna 15 with wavelength compression caused by the retardation plate 15B. Thereby, the microwave is emitted from the slits 15a and 15b generally in the direction perpendicular to the plane of the radiation plate 15C in the form of a circular polarized microwave.

Further, as shown in FIG. 1A, a rare gas source 101A such as an Ar gas source and a nitrogen gas source 101B are connected to the gas ring 14 via respective mass flow controllers 103A and 103N and via respective corresponding valves 104A, 104N, 105A, 105N and a common valve 106. As noted before, the gas ring 14 is provided with a large number of gas inlet ports around the stage 12 uniformly, and the rare gas and the nitrogen gas supplied to the gas ring 14 are introduced into the processing space 14A inside the processing vessel 11 uniformly. In addition, an oxygen gas source 1010 is connected to the gas ring 14 via a mass flow controller 1030 and valves 1040 and 1050 in the illustrated example for supplying oxygen to the processing vessel 11.

In operation, the processing space inside the processing vessel 11 is set to a predetermined pressure by evacuating through the evacuation port 11C, and an oxidizing gas or a nitriding gas is introduced from the gas ring 14 together with an inert gas such as Ar, Kr, Xe, Ne, Ne (rare gas) and the like.

Further, a microwave having the frequency of several GHz such as 2.45 GHz is introduced from the microwave source 112 via the antenna 15, and there is excited high-density microwave plasma in the processing vessel 11 at the surface of the substrate W to be processed with a plasma density of $10^{11}$-$10^{13}$/cm$^3$. By exciting the plasma by the microwave introduced via the antenna, the plasma has low electron temperature of 0.7-2 eV or less, preferable 1.5 eV or less, with the substrate processing apparatus of FIG. 1A, and damaging of the substrate W or the inner wall of the processing vessel is avoided. Further, the radicals thus formed are caused to flow in the radial direction along the surface of the substrate W to be processed and are evacuated promptly. Thereby, recombination of the radicals is suppressed, and an extremely uniform and efficient substrate processing is realized at the low temperature of 550° C. or less.

Figure 2A:
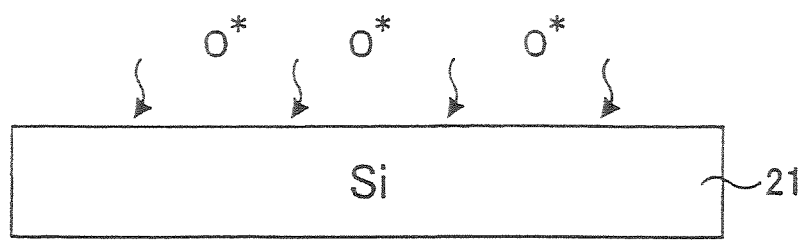
FIGS. 2A-2C are diagrams showing the oxidation processing of a silicon substrate and nitridation processing of an oxide film conducted by the substrate processing apparatus of FIGS. 1A and 1B according to a first embodiment of the present invention.
Figure 2B:
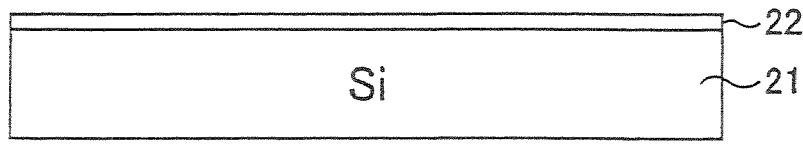
Figure 2C:
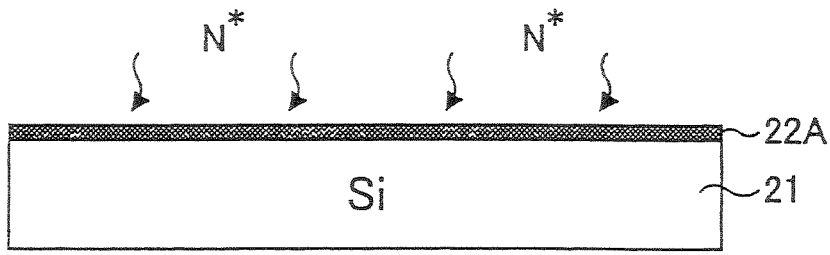

FIGS. 2A-2C show the substrate processing process according to an embodiment of the present invention that uses the substrate processing apparatus 10 of FIGS. 1A and 1B.

Referring to FIG. 2A, a silicon substrate 21 is introduced into the processing vessel 11 of the substrate processing apparatus 10 as a substrate W to be processed, and a mixed gas of Kr and oxygen is introduced from the gas ring 14. Further, atomic state oxygen O* (oxygen radial) is formed by exciting the same with microwave-plasma. As a result of processing of the surface of the silicon substrate 21 with such atomic state oxygen O*, there is formed a silicon oxide film 22 on the surface of the silicon substrate 21 with the thickness of 1.6 nm as shown in FIG. 2B. The silicon oxide film 22 thus formed has a leakage current characteristic comparable with that of a thermal oxide film formed at a high temperature of 700° C. or more, in spite of the fact that it is formed at a very low temperature of about 400° C. Alternatively, the silicon oxide film 22 may be a thermal oxide film.

Next, in the step of FIG. 2C, a mixed gas of Ar and nitrogen is introduced into the processing vessel 11 in the substrate processing apparatus 10 of FIGS. 1A and 1B, and excitation of plasma is made by supplying a microwave power while setting the substrate temperature to about 400° C.

In the step of FIG. 2C, it should be noted that the internal pressure of the processing vessel 11 is set to 5-7 Pa and the Ar gas is supplied with the flow rate of 1000 SCCM, for example. Further, the nitrogen gas is supplied with the flow rate of 40 SCCM, for example. As a result, the surface of the silicon oxide film 22 is nitrided and is converted to a silicon oxynitride film 22A.

FIG. 3 shows the SIMS profile showing the distribution of the oxygen atoms and nitrogen atoms (continuous line A) in the oxynitride film 22A thus processed with the nitridation processing.

Referring to FIG. 3, the interface between the oxynitride film 22A and the silicon substrate 21 is located at the depth of about 1.6 nm, and it can be seen that there appears a maximum concentration of the nitrogen atoms at the central part of the oxynitride film 22A in the thickness direction. Further, the result of FIG. 3 indicates that the nitrogen atoms distribute generally in the entirety of the oxynitride film 22A except for the film surface and the region right underneath the film surface, while this also means that there exits substantial amount of nitrogen atoms also in the vicinity of the interface between the oxynitride film 22A and the silicon substrate 21.

FIG. 3 also shows the distribution of the nitrogen atoms in the oxynitride film 22A for the case the processing of FIG. 2C is conducted under the same condition except that the processing pressure is changed to 60-130 Pa by a broken line B.

Referring to FIG. 3 again, it will be noted that the number of the nitrogen atoms incorporated into the oxynitride film 22A is decreased in the case the nitridation processing of FIG. 2C is conducted under such a high processing pressure, as compared with the case the processing pressure is low, and associated with this, the nitrogen concentration in the film is reduced also. Particularly, in the case the nitridation processing is conducted under such a high processing pressure, it will be noted that the nitrogen concentration in the vicinity of the interface between the oxynitride film 22A and the silicon substrate 21 is below the detection limit and that there exist little nitrogen in such a part.

Thus, by conducting the nitridation processing of the oxide film of FIG. 2C at high processing pressure, it becomes possible to restrict the distribution of the nitrogen atoms in the oxynitride film 22A at the shallow part thereof. By using such an oxynitride film 22A for the gate insulation film of a MOS transistor, it becomes possible to eliminate the problem of degradation of the carrier mobility or variation of the threshold voltage caused by the existence of the nitrogen atoms in the vicinity of the interface between the oxynitride film 22A and the silicon substrate.

Figure 4:
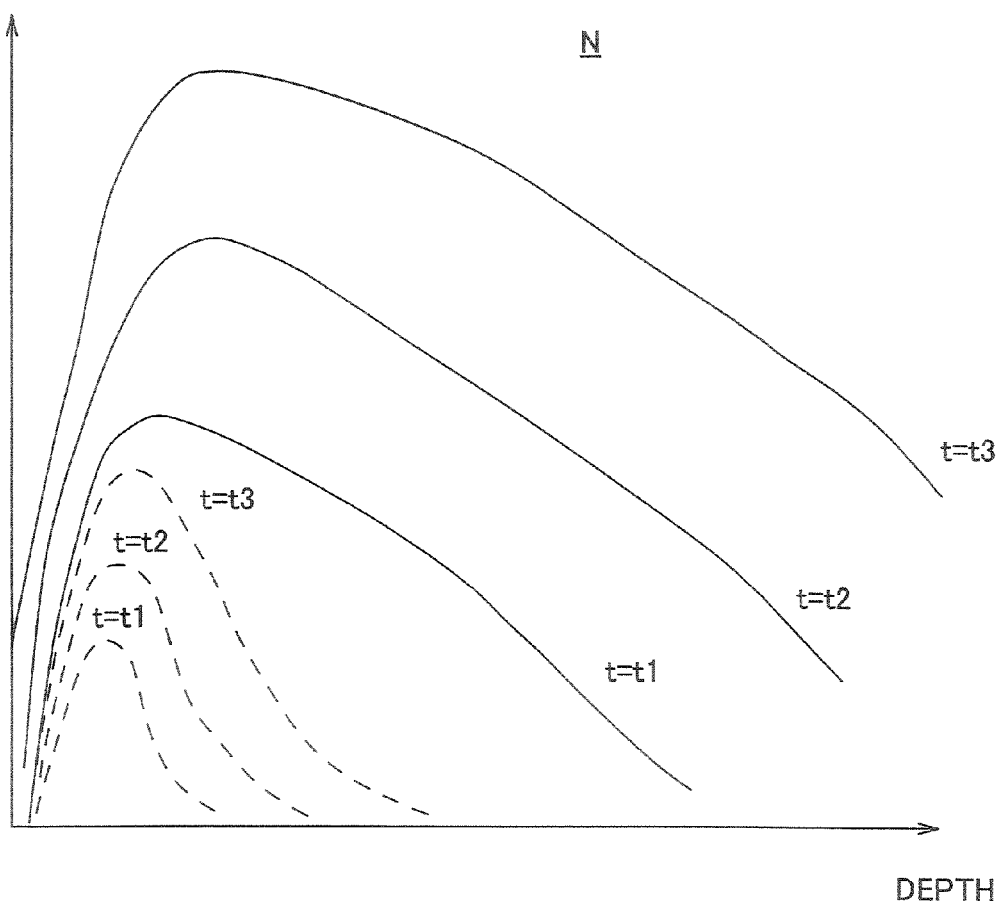
FIG. 4 is a diagram showing the time-dependent change of the nitrogen atom distribution in the oxynitride film of FIG. 3.

FIG. 4 is a diagram showing the time-dependent change of the distribution of the nitrogen atoms in the film for the case the nitridation processing of FIG. 2C is conducted at a high pressure of 60-130 Pa (broken line) and the case in which the nitridation processing is conducted at a low processing pressure (continuous line).

Referring to FIG. 4, it will be noted that the depth of penetration of the nitrogen atoms in the oxynitride film 22A is limited in the case the processing pressure is high, and thus, it is concluded that the nitridation processing conducted at a high processing pressure exceeding 60 Pa is suited for introducing nitrogen only to a part of an extremely thin oxynitride film such as the one having the thickness of 1 nm or less. On the other hand, in the case the processing pressure is low, the nitrogen atoms distribute over the entirety of the oxynitride film, and thus, the nitridation processing under low processing pressure of 60 Pa or less is suitable for uniformly nitriding an oxynitride film of relatively large thickness such as the one having the thickness of 1 nm or more.

It is believed that the results of FIGS. 3 and 4 reflect the situation that, in the case the processing pressure is increased in the nitridation processing of FIG. 2C, there is caused a decrease of electron temperature and the nitrogen ions formed in the plasma are less susceptible for acceleration in the direction toward the substrate. Thereby, the nitrogen ions are deactivated before they reach the substrate and cause nitridation therein. In the case the processing pressure is set low, on the other hand, there occurs increase of electron temperature, and the nitrogen ions are accelerated toward the substrate. Thereby, the nitrogen ions reach the substrate in the active state and facilitate the nitridation therein.

Figure 5:
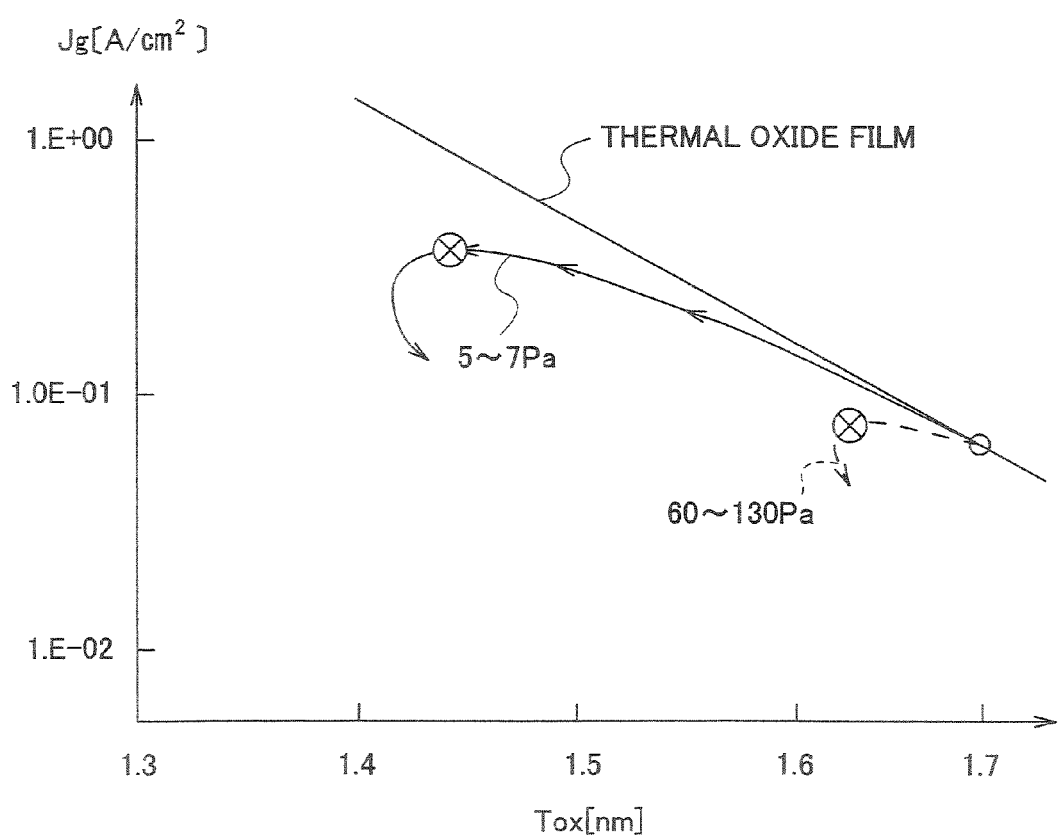
FIG. 5 is a diagram showing the relationship between the leakage current and the oxide-film equivalent thickness of the oxide film associated with the nitridation process of the present embodiment.

FIG. 5 shows the leakage characteristics of an N-type MOS capacitor in which the oxynitride film formed according to the method of the present invention is used for the gate insulation film. In FIG. 5, it should be noted that the oxynitride film is formed by two methods, the first being the one conducting the nitridation processing of FIG. 2C for the oxide film having the thickness of 1.6 nm under a high processing pressure of 60-130 Pa for various processing durations and the second being the one conducting the nitridation processing of FIG. 2C for the oxide film having the thickness of 1.6 nm under a low pressure of 5-7 Pa, wherein the vertical axis represents the gate leakage current density Jg for the case a gate voltage of −1.8V is applied, while the horizontal axis represents the oxide-film equivalent thickness Tox.

In FIG. 5, the broken line shows the results for the case of using the high processing pressure, while the continuous line represents the case of using the low processing pressure.

Referring to FIG. 5, it will be noted that there is caused a decrease in the oxide-film equivalent thickness Tox when the nitridation processing of FIG. 2C is conducted under the foregoing low processing pressure to about 1.4 nm as a result of penetration of the nitrogen atoms into the oxide film, and there is also achieved suppression of increase of the leakage current. On the other hand, when the nitridation processing is continues for a long time, there is caused a turn-around phenomenon, and the leakage current starts to decrease, while this decrease of the leakage current is accompanied with increase of the oxide-film equivalent thickness Tox. It is believed that this reflects the situation that, with extensive invasion of the nitrogen atoms into the oxide film 12 at the time of formation of the oxynitride film 12A, the oxygen atoms in the film start to invade into the silicon substrate, resulting in the increase of the physical thickness of the oxynitride film 12A. It should be noted that such invasion of the oxygen atoms into the silicon substrate causes deterioration in the interface between the oxynitride film 12A and the silicon substrate 12. Thus, at the time of forming the oxynitride film 12A by introducing nitrogen into the oxide film 12 in the step of FIG. 2C, it becomes possible to minimize the oxide-film equivalent thickness Tox of the oxynitride film 12A without deteriorating the film quality, by realizing the state immediately before the turn-around.

In the case the nitridation processing of FIG. 2C is conducted under the high processing pressure, on the other hand, the amount of the nitrogen atoms incorporated into the film is small, and thus, the decrease of the oxide-film equivalent thickness is small as represented in FIG. 5 by the broken line. On the other hand, the increase of the leakage current associated with the decrease of the oxide film equivalent thickness is suppressed further. Thus, it should be noted that the gradient of the curve shown in FIG. 5 is smaller than the gradient of the curve represented by the continuous line.

Figure 6:
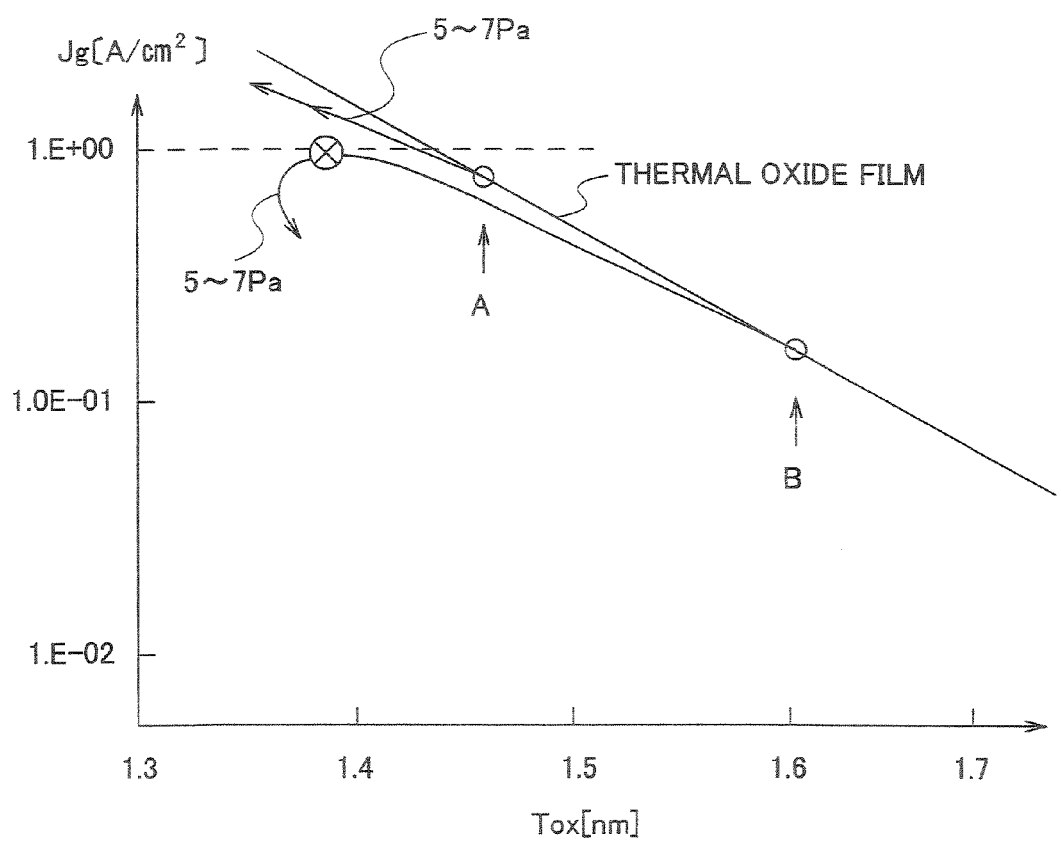
FIG. 6 is another diagram showing the relationship between the leakage current and the oxide-film equivalent thickness of the oxide film associated with the nitridation process of the present embodiment.

Thus, in the case the allowable leakage current is 1 A/cm$^2$ for the applied voltage of −1.8V as shown in FIG. 6, it will be noted that this allowable leakage current is exceeded when the nitrogen atoms are introduced with the nitridation processing at 5-7 Pa, provided that the oxide film has the initial thickness of 1.45 nm in the state of FIG. 2B, as represented by an arrow A.

In the example of FIG. 6, it will be noted that, in the case the oxide film 12 has the initial thickness of about 1.6 nm as shown by the arrow B, the leakage current density immediately before the turn around point is generally equal to the allowable limit value, provided that the foregoing nitridation processing is conducted at the low pressure of 5-7 Pa. From this, it is concluded that the leakage current exceeds the allowable limit in the case the nitridation processing is conducted under the low pressure of 5-7 Pa for the oxide film 12 having the initial thickness of 1.6 nm or less and that it is preferable to conduct the foregoing nitridation processing under the high pressure of 60-130 Pa, not with the foregoing low pressure.

In the case the nitridation processing is conducted in the pressure range of 60-130 Pa, the proportion of increase of the leakage current associated with the decrease of the equivalent thickness is small, and thus, the requirement of the leakage current value of 1 A/cm$^2$ is satisfied even in the case the initial thickness if less than 1.6 nm.

On the other hand, when the initial thickness of the oxide film exceeds 1.6 nm, it is preferable to set the processing pressure of the nitridation processing of FIG. 2C to be less than 30 Pa, preferably 5-7 Pa.

Thus, according to the present invention, it becomes possible to achieve, at the time of nitridation processing of an oxide film, the leakage current of the obtained oxynitride film to fall within a desired allowable range, by choosing the processing pressure of the nitridation processing in response to the thickness of the initial film thickness of the oxide film.

Second Embodiment

Figure 7A:
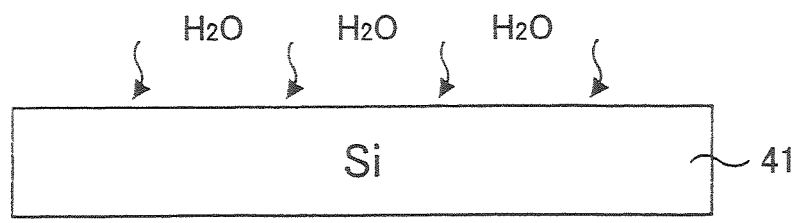
FIGS. 7A-7C are diagrams showing the oxidation processing of a silicon substrate and nitridation processing of an oxide film according to a second embodiment of the present invention.
Figure 7B:
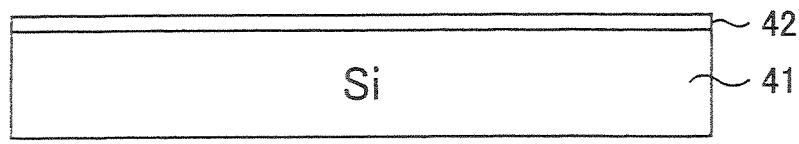
Figure 7C:
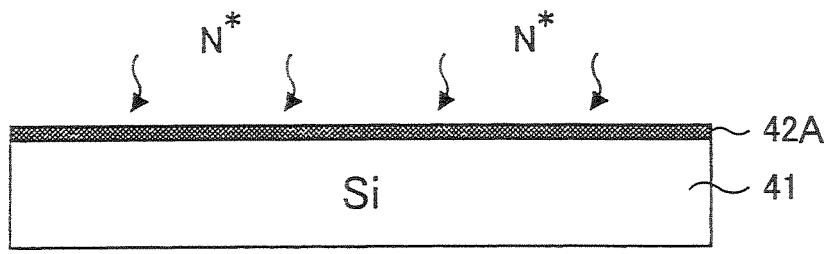

FIGS. 7A-7C show the substrate processing process according to second embodiment of the present invention that uses the substrate processing apparatus 10 of FIGS. 1A and 1B.

Referring to FIG. 7A, a silicon substrate 41 is processed with a so-called wet oxidation process by processing the silicon substrate 41 in a furnace supplied with H$_2$O (moisture).

With such a wet oxidation processing, there is formed a silicon oxide film 42 on the surface of the silicon substrate 41 with the thickness of about 1 nm as shown in FIG. 7B.

Further, in the step of FIG. 7C, a mixed gas of Ar and nitrogen is introduced into the processing vessel 11 in the substrate processing apparatus 10 of FIGS. 1A and 1B, and excitation of plasma is made by supplying a microwave while setting the substrate temperature to about 400° C.

In the step of FIG. 4C, the internal pressure of the processing vessel 11 is set to 5-7 Pa, and the Ar gas is supplied with the flow rate of 1000 SCCM, for example. Further, the nitrogen gas is supplied with the flow rate of 40 SCCMM, for example. As a result, the surface of the oxide film 42 is nitrided and is converted to a silicon oxynitride film 42A, similarly to the process of FIG. 2C.

Third Embodiment

Figure 8A:
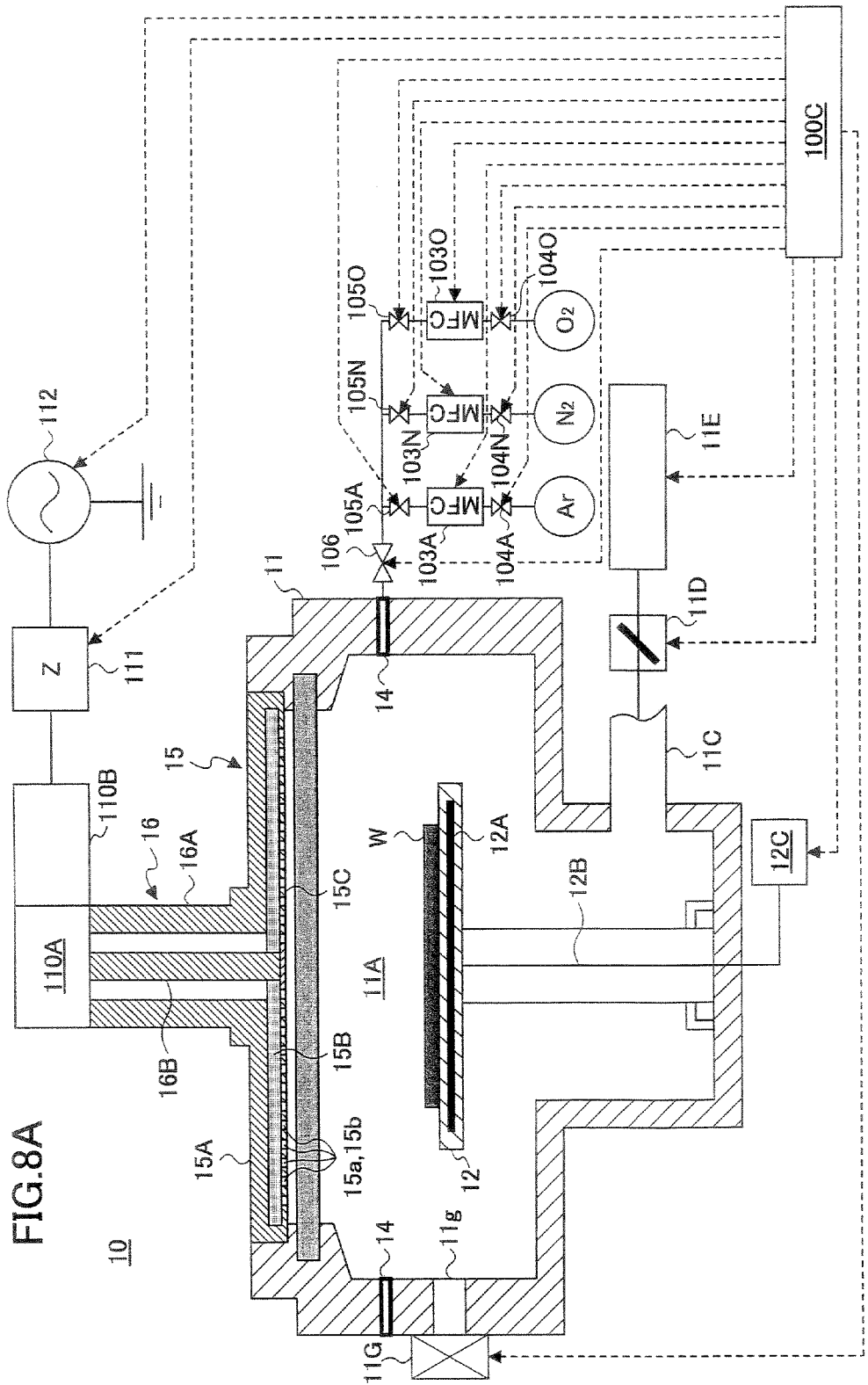
FIGS. 8A and 8B are diagrams respectively showing the overall construction of the substrate processing system according to a third embodiment of the present invention including the substrate processing apparatus of FIGS. 1A and 1B and used with the present invention for substrate processing and the construction of a computer used for controlling the substrate processing system of FIG. 8A.

FIG. 8A shows the construction of an overall substrate processing system 100 that includes the substrate processing apparatus 10 of FIGS. 1A and 1B and used for the nitridation processing of the oxide film of the present invention, while FIG. 7B shows a computer used for controlling the substrate processing apparatus 10 of FIG. 1A and 1B in the system of FIG. 8A.

Referring to FIG. 8A, the system 100 includes the Ar gas source 101A, the nitrogen gas source 101B and the oxygen gas source 101O, wherein the Ar gas source 101A supplies an Ar gas to the gas ring 14 of the substrate processing apparatus 10 via the mass flow controller 103A and via the valves 104A and 105A and further via the valve 106, while the nitrogen gas source 101B supplies a nitrogen gas to the gas ring 14 via the mass flow controller 103N and via the valves 104N and 105N and further via the valve 106 coupled to the gas ring 14 commonly to the gas supply path of the Ar gas and the gas supply path of the nitrogen gas. Further, the oxygen gas source 101O supplies an oxygen gas to the gas ring of the substrate processing apparatus 10 via the mass flow controller 103O and the valves 104O, 105O and the valve 106.

Further, the system 100 includes the microwave power source 112 that supplies the microwave power to the radial line slot antenna 15 via an impedance matcher 111.

Further, the heating mechanism 12A is provided in the stage 12 for temperature control of the substrate W to be processed.

Further, the system 100 includes the evacuation system 11E coupled to the evacuation port 11C via the adaptive pressure controller 11D.

Further, the system 100 includes the gate valve 11G cooperating with the substrate in/out opening 11g provided on the processing vessel 11 for loading and unloading the substrate W to be processed to and from the processing vessel 11.

Further, it should be noted that there is provided a system controller 100C that controls the mass flow controllers 103A, 103B, and 103O, valves 104A, 104N, 104O, 105A, 105N, 105O and 106, the heating mechanism 12H, an evacuation pump not illustrated, and further the gate valve 11G according to the program held therein, and the substrate processing apparatus 10 performs the foregoing nitridation processing or oxidation processing and nitridation processing of the oxide film under control of the controller 100C.

Figure 8B:
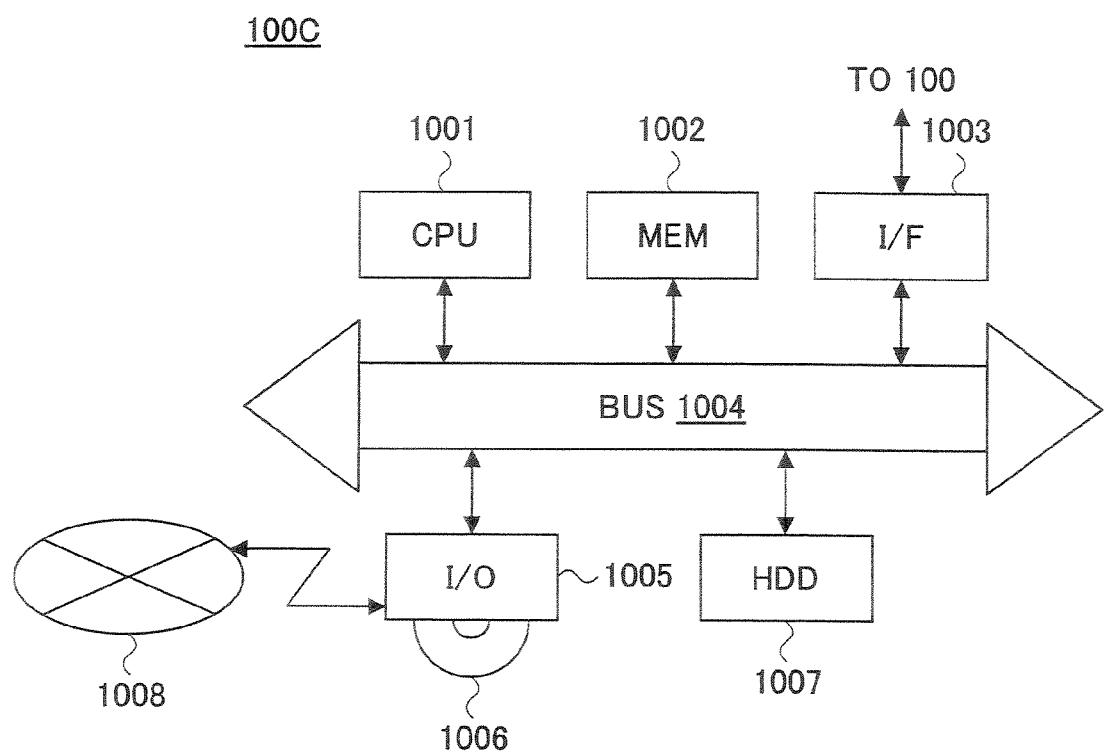

FIG. 8B shows the construction of the controller 100C.

Referring to FIG. 8B, the controller 100C is a general purpose computer and includes a CPU 1001, a memory 1002 holding a program and data, an interface unit 1003 connected to the system 100, and an I/O interface 1005 connected with each other by a system bus 1004, wherein the computer 100C is provided with the control program of the substrate processing system 100 from a recording medium 1006 such as an optical disk or a floppy disk or from a network 1007 and controls the substrate processing system 100 of FIG. 19A including the substrate processing apparatus 10 via the interface unit 1003.

Thus, the present invention also includes such a computer configured by the program code means recorded on a processor-readable medium and also the processor readable medium that carries such a program code.

Figure 9:
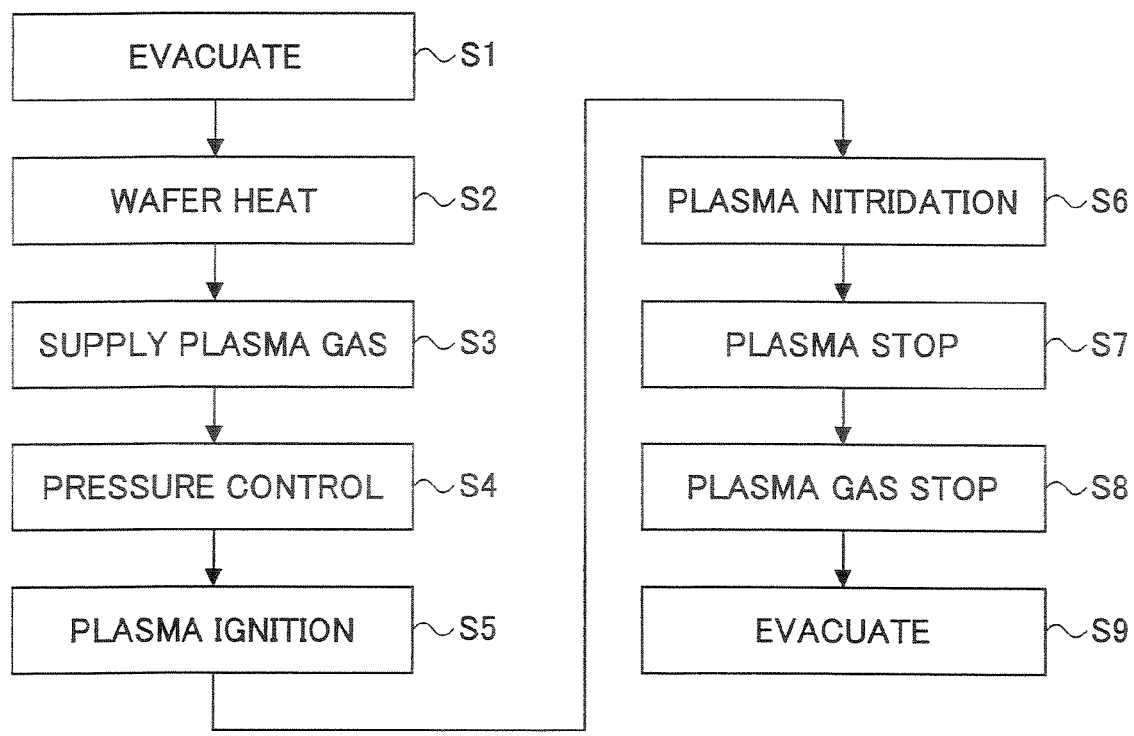
FIG. 9 is a flowchart of the computer-controlled processing according to the present invention.

FIG. 9 shows a nitridation processing corresponding to FIG. 2C or FIG. 7C conducted with the plasma substrate processing apparatus 10 of FIGS. 1A and 1B under the control of the system controller 101C.

Referring to FIG. 8, the processing vessel 11 is evacuated in the step 1 by controlling the evacuation system 11E and the adaptive pressure controller 11D, and the substrate W to be processed is introduced into the processing vessel 11.

Next, in the step 2, the substrate W held on the stage 12 is heated to a predetermined temperature by energizing the heater 12 via the power source 12C.

Next, in the step 3, the rare gas such as Ar is introduced into the processing vessel 11 from the gas source 101A by controlling the valves 104A, 105A and 106 and the mass flow controller 103A, and the pressure inside the processing vessel 11 is controlled to a predetermined pressure by controlling the adaptive pressure controller 11D.

Next, in the step 5, the microwave source 112 and the impedance matcher 111 are controlled, and plasma is ignited in the processing vessel 11A in correspondence to the processing space 11A.

Next, in the step 6, the nitrogen gas in the gas source 101N is introduced into the processing vessel 11 by controlling the valves 104N, 105N and 106 and further the mass flow controller 103N.

After the nitridation process, the plasma is deenergized in the step 7 by controlling the microwave source 112 and the impedance matcher 111, and the supply f the plasma gas and the nitrogen gas is stopped by controlling the valves 104A, 104N, 105A, 105N, 106 and the mass flow controllers 103A and 1036B.

Further, in the step 9, the adaptive pressure controller 11D and the evacuation system 11E are controlled and the pressure inside the processing vessel 11 is controlled to a predetermined pressure for taking out the substrate W thus processed.

Further, while the present invention has been described with regard to preferable embodiments, it should be noted that the present invention is not limited to such specific embodiments but various variations and modifications may be made without departing from the scope of the invention described in the claims.

According to the present invention, it becomes possible to obtain an oxynitride film by a nitridation processing of an oxide film that uses nitrogen radicals excited by a microwave introduced by a planar antenna, such that the oxynitride film has optimum characteristics including the leakage current characteristics, by choosing the processing pressure in response to the initial thickness of the oxide film.

The invention claimed is:

1. A method for nitriding a gate oxide film, comprising the steps of:
    forming a gate oxide film on a substrate;
    forming plasma of a mixed gas of a rare gas and a nitriding gas over said gate oxide film; and
    nitriding a surface of said gate oxide film by said plasma, said nitriding step being conducted by said plasma formed under a pressure of 60 Pa or less, said nitriding step thereby converting said gate oxide film into a gate oxynitride film.

2. The method as claimed in claim 1, wherein said step of forming said gate oxide film is conducted by any of a thermal annealing process of said substrate or oxidation of said substrate by plasma containing oxygen.

3. The method as claimed in claim 1, wherein said gate oxide film has a thickness of 1 nm or more.

4. The method as claimed in claim 1, wherein said rare gas is any of a Kr gas or an Ar gas.

5. The method as claimed in claim 1, wherein said rare gas comprises an Ar gas, said nitriding gas comprises a nitrogen gas, and wherein said nitriding step is conducted by supplying said Ar gas with a flow rate of 1000 sccm an said nitrogen gas with a flow rate of 40 sccm.

6. The method as claimed in claim 1, wherein said step of nitriding said gate oxide film is conducted at a process temperature of 550° C. or less.

7. The method as claimed in claim 1, wherein said nitriding step is conducted with controlled nitrogen concentration such that there is formed a peak of nitrogen concentration in said gate oxynitride film below a top surface of said gate oxide film but above an interface of said gate oxide film and said substrate.

8. A method for nitriding a gate oxide film, comprising the steps of:
    forming a gate oxide film on a substrate;
    forming plasma of a mixed gas of a rare gas and a nitriding gas on said gate oxide film; and
    nitriding a surface of said gate oxide film by said plasma, said nitriding step being conducted by said plasma formed under a pressure of 60-130 Pa, said nitriding step thereby converting said gate oxide film into a gate oxynitride film.

9. The method as claimed in claim 8, wherein said step of forming said gate oxide film is conducted by a thermal annealing process of said substrate or oxidation of said substrate by plasma containing oxygen.

10. The method as claimed in claim 8, wherein said gate oxide film has a thickness of 1 nm or less.

11. The method as claimed in claim 8, wherein said rare gas is any of a Kr gas or an Ar gas.

12. The method as claimed in claim 8, wherein said rare gas comprises an Ar gas, said nitriding gas comprises a nitrogen gas, and wherein said nitriding step is conducted by supplying said Ar gas with a flow rate of 1000 sccm and said Ar gas with a flow rate of 40 sccm.

13. The method as claimed in claim 8, wherein said step of nitriding said gate oxide film is conducted at a process temperature of 550° C. or less.

14. The method as claimed in claim 7, wherein said nitrogen concentration is controlled such that no nitrogen is detected at said interface.

15. A method for nitriding a gate oxide film, comprising the steps of:
    providing a substrate carrying thereon a gate oxide film;
    forming plasma of a mixed gas of a rare gas and a nitriding gas on said gate oxide film; and
    nitriding a surface of said gate oxide film by said plasma, said nitriding step being conducted by said plasma formed under a pressure of 60 Pa or less, said nitriding step thereby converting said gate oxide film into a gate oxynitride film.

16. The method as claimed in claim 15, wherein said gate oxide film is an oxide film formed by a thermal annealing process of said substrate or oxidation of said substrate by plasma containing oxygen.

17. The method as claimed in claim 15, wherein said gate oxide film has a thickness of 1 nm or less.

18. The method as claimed in claim 15, wherein said rare gas is any of a Kr gas or an Ar gas.

19. The method as claimed in claim 15, wherein said
rare gas comprises an Ar gas, said nitriding gas comprises a nitrogen gas, and wherein said nitriding step is conducted by supplying said Ar gas with a flow rate of 1000 sccm and said Ar gas with a flow rate of 40 sccm.

20. The method as claimed in claim 15, wherein said step of nitriding said gate oxide film is conducted at a process temperature of 550° C. or less.

21. The method as claimed in claim 15, wherein said nitriding step is conducted with controlled nitrogen concentration such that there is formed a peak of nitrogen concentration in said gate oxynitride film below a top surface of said gate oxide film but above an interface of said gate oxide film and said substrate.

22. A method for nitriding a gate oxide film, comprising the steps of:
providing a substrate carrying thereon a gate oxide film;
forming plasma of a mixed gas of a rare gas and a nitriding gas on said gate oxide film; and
nitriding a surface of said gate oxide film by said plasma, said nitriding step being conducted by said plasma formed under a pressure of 60-130 Pa, said nitriding step
thereby converting said gate oxide film into a gate oxynitride film.

23. The method as claimed in claim 22, wherein said gate oxide film is an oxide film formed by a thermal annealing process of said substrate or oxidation of said substrate by plasma containing oxygen.

24. The method as claimed in claim 22, wherein said gate oxide film has a thickness of 1 nm or less.

25. The method as claimed in claim 22, wherein said rare gas is any of a Kr gas or an Ar gas.

26. The method as claimed in claim 22, wherein said rare gas comprises an Ar gas, said nitriding gas comprises a nitrogen gas, and wherein said nitriding step is conducted by supplying said Ar gas with a flow rate of 1000 sccm and said Ar gas with a flow rate of 40 sccm.

27. The method as claimed in claim 22, wherein said step of nitriding said gate oxide film is conducted at a process temperature of 550° C. or less.

28. The method as claimed in claim 22, wherein said nitriding step is conducted with controlled nitrogen concentration such that there is formed a peak of nitrogen concentration in said gate oxynitride film below a top surface of said gate oxide film but above an interface of said gate oxide film and said substrate.

29. A substrate processing method, comprising:
providing a substrate having an oxide film on a silicon substrate surface; and
introducing nitrogen atoms into said oxide film by exposing said oxide film to nitrogen radicals or nitrogen ions excited in plasma;
wherein said providing of said oxide film comprises forming said oxide film with a thickness less than 1 nm, and
wherein said exposing to said nitrogen radicals is conducted under a processing pressure not less than 60 Pa.

30. The substrate processing method as claimed in claim 29, wherein said oxide film is any of an oxide film formed by oxidation of said silicon substrate surface by plasma of an oxygen-containing gas or a thermal oxide film.

31. The method as claimed in claim 28, wherein said nitrogen concentration is controlled such that no nitrogen is detected at said interface.

* * * * *